US009813056B2

(12) United States Patent
Shao et al.

(10) Patent No.: US 9,813,056 B2
(45) Date of Patent: Nov. 7, 2017

(54) ACTIVE DEVICE DIVIDER CIRCUIT WITH ADJUSTABLE IQ

(71) Applicant: Analog Devices Global, Hamilton (BM)

(72) Inventors: Bin Shao, Shanghai (CN); Danzhu Lu, Shanghai (CN); Junxiao Chen, Shanghai (CN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/885,601

(22) Filed: Oct. 16, 2015

(65) Prior Publication Data

US 2017/0085263 A1  Mar. 23, 2017

Related U.S. Application Data

(63) Continuation of application No. PCT/CN2015/090143, filed on Sep. 21, 2015.

(51) Int. Cl.
*H03K 17/10* (2006.01)
*H03K 17/06* (2006.01)
*H03K 17/687* (2006.01)
*H03K 17/22* (2006.01)

(52) U.S. Cl.
CPC ....... *H03K 17/6871* (2013.01); *H03K 17/223* (2013.01)

(58) Field of Classification Search
CPC .................................................. H03K 17/6871
USPC ................................................ 327/365–508
See application file for complete search history.

(56) References Cited

U.S. PATENT DOCUMENTS

| 4,069,430 A | 1/1978 | Masuda |
| 4,152,716 A | 5/1979 | Torii et al. |
| 4,675,557 A | 6/1987 | Huntington |
| 4,833,342 A * | 5/1989 | Kiryu ...................... G05F 3/247 323/313 |
| 6,424,218 B1 | 7/2002 | Barber et al. |
| 6,455,952 B1 * | 9/2002 | Wang ........................ G05F 1/46 307/15 |
| 7,019,585 B1 | 3/2006 | Wilson et al. |
| 7,091,770 B2 * | 8/2006 | Schlaffer ................... G05F 3/24 323/316 |
| 7,274,176 B2 | 9/2007 | Mihara |

(Continued)

OTHER PUBLICATIONS

Glaser, Chris, "$I_Q$: What it is, what it isn't, and how to use it", © 2011 Texas Instruments Incorporation, *Analog Applications Journal*, (2011), 18-22, (7 pgs.).

(Continued)

*Primary Examiner* — Brandon S Cole
(74) *Attorney, Agent, or Firm* — Schwegman Lundberg & Woessner, P.A.

(57) ABSTRACT

An active voltage divider circuit is provided comprising: a first node; a second node; a third node; multiple FET load devices coupled in series between the first node and the second node; multiple first switches, each associated with a different FET load device and configured to selectably couple a respective associated bypass circuit between source and drain of its associated FET load device; and second switch circuitry configured to selectably couple a drain of a FET load device, from among the multiple FET load devices, to the third node.

20 Claims, 9 Drawing Sheets

(56) References Cited

U.S. PATENT DOCUMENTS

| | | | |
|---|---|---|---|
| 8,816,591 B2* | 8/2014 | Chu | H05B 33/0824 |
| | | | 315/193 |
| 9,246,455 B2* | 1/2016 | Murden | H03F 3/45179 |
| 2003/0117348 A1* | 6/2003 | Knapp | G09G 3/3233 |
| | | | 345/76 |
| 2009/0230285 A1 | 9/2009 | Wright | |
| 2010/0231135 A1* | 9/2010 | Hum | H05B 33/0815 |
| | | | 315/250 |
| 2010/0288933 A1* | 11/2010 | Duraj | G01T 1/185 |
| | | | 250/362 |
| 2010/0289472 A1 | 11/2010 | Renous | |
| 2011/0291738 A1* | 12/2011 | Biela | H03K 17/08142 |
| | | | 327/430 |
| 2012/0081009 A1* | 4/2012 | Shteynberg | H05B 33/083 |
| | | | 315/122 |
| 2012/0091920 A1* | 4/2012 | Yang | H05B 33/0824 |
| | | | 315/320 |
| 2013/0193525 A1* | 8/2013 | Weis | H03K 17/063 |
| | | | 257/379 |
| 2013/0308407 A1 | 11/2013 | Shyanmugam et al. | |
| 2014/0062585 A1* | 3/2014 | Weis | H03K 17/102 |
| | | | 327/541 |
| 2014/0239833 A1* | 8/2014 | McCune, Jr. | H05B 33/0815 |
| | | | 315/201 |

OTHER PUBLICATIONS

Lee, Bang S., "Understanding the Terms and Definitions of LDO Voltage Regulators", Application Report SLVA079, © 1999, Texas Instruments Incorporated, (Oct. 1999), 13 pgs.

Nork, Sam, et al., "Ultralow Quiescent Current DC/DC Converters for Light Load Applications—Design Note 142", © 1996 Linear Technology Corporation, (1996), 2 pgs.

Glaser, Chris, "IQ: What it is, what it isn't, and how to use it", Power Management—Texas Instruments Incorporated—High-Performance Analog Products—www.ti.com/aaj 2Q 2011—Analog Applications Journal, (Apr. 1, 2011), 18-24.

* cited by examiner

ACTIVE DEVICE DIVIDER CIRCUIT WITH ADJUSTABLE IQ

BACKGROUND

A quiescent current (IQ) of an integrated circuit (IC) is an operating current required to operate an IC's basic functionality, such as for example, powering an internal precision reference voltage, an oscillator, a thermal shutdown circuit, a state machine or other logic gates. IQ is generally defined as the current drawn by an IC in a no-load and nonswitching but enabled condition. The IQ travels inside the IC to ground. In a no load condition, typically, no current leaves the IC to an output terminal. In a nonswitching condition, typically, no power switch in the IC is on (closed). For some ICs, this means that the IC is in a high-impedance condition with a power stage that is disconnected from the output, except perhaps for certain IC components such as integrated MOSFET body diodes that cannot be turned off. In an enabled condition, typically, the IC is turned on and is not in a shutdown condition.

A voltage divider circuit includes multiple voltage load components, across which voltage drops, which are coupled in series between a first node and a second node. Voltage is measured at junctions between the voltage load components. A bias voltage is applied to the first node. A voltage at each junction is proportional to the voltage drop across the series-connected electrical components disposed between that junction and the second node.

Figure 1:
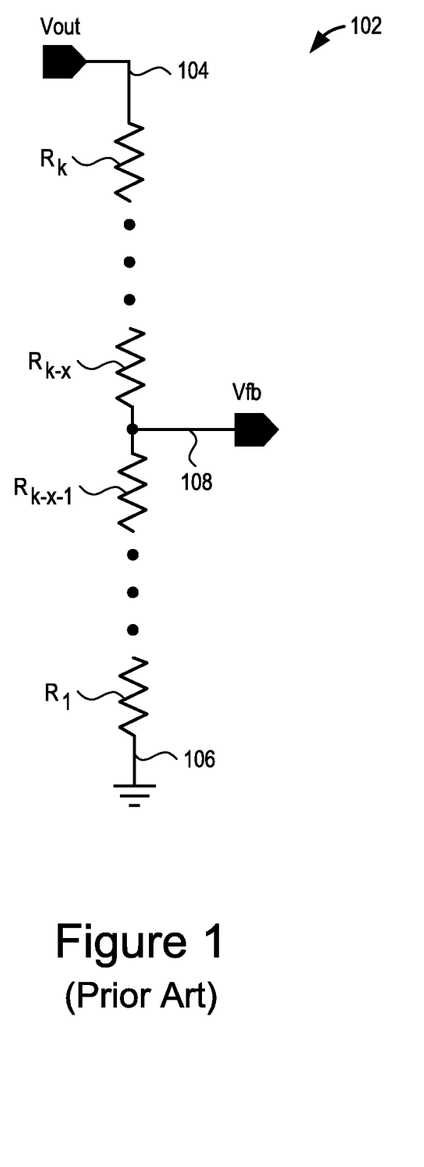
FIG. 1 is an illustrative drawing representing a resistor voltage divider circuit that includes multiple resistors coupled in series.

FIG. 1 is an illustrative drawing representing a resistor voltage divider circuit 102 that includes multiple resistors coupled in series. The exampled resistor voltage divider circuit includes resistors $R_1$ to $R_k$ that each acts as a resistor load voltage coupled in series between a first node and a second node. A divider output voltage is provided at a junction between two resistors coupled between the first and second nodes. The first node 104 is coupled to a bias voltage $V_{out}$. The second node 106 is coupled to ground. For example, a third node 108 is shown at a junction between resistors $R_{k-x}$ and $R_{k-x-1}$. The divider output voltage at the third node is equals the voltage drop across the k-x-1 resistors coupled between $R_{k-x}$ and ground divided by a total voltage drop across all k resistors. Typically, a resistor voltage divider in an IC includes diffused resistors coupled in series to provide divided voltage outputs at junctions between the resistors. Unfortunately, such a structure ordinarily requires a relatively surface large area, which is not preferred in an IC.

Figure 2:
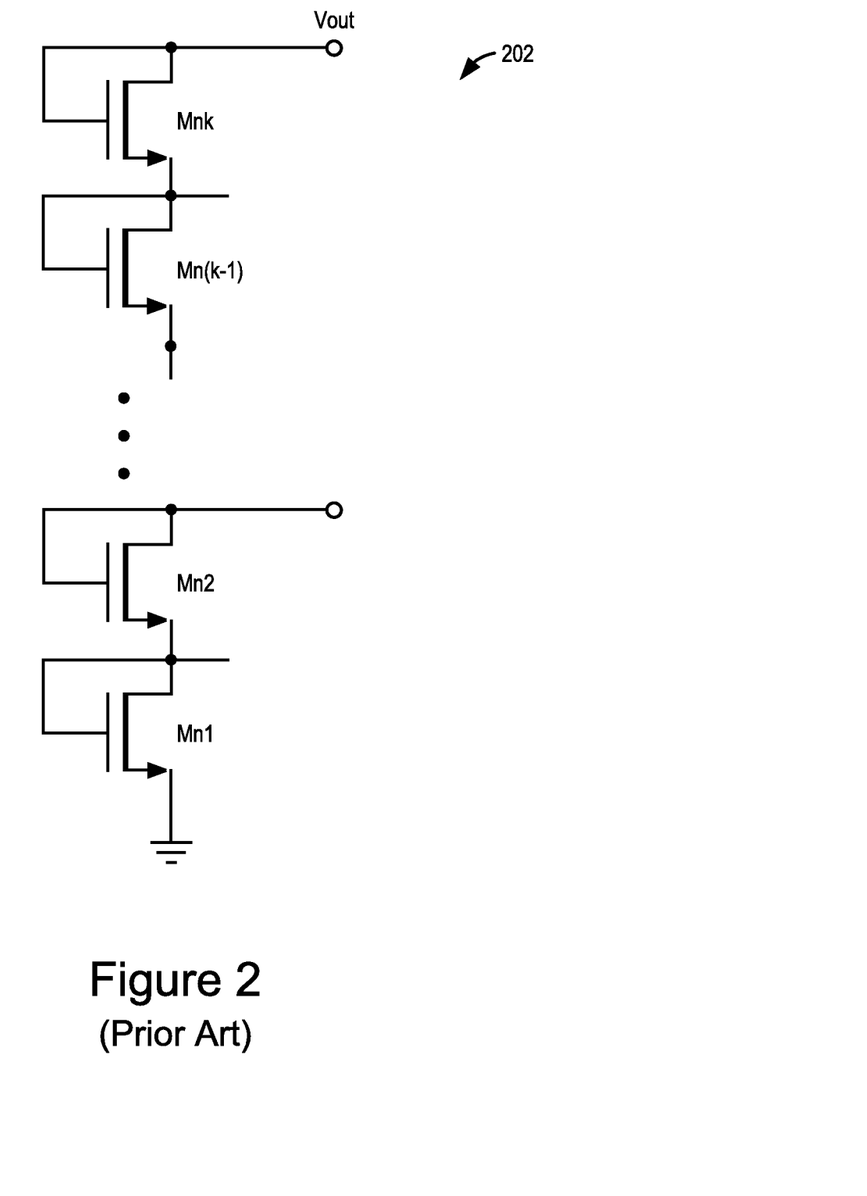
FIG. 2 is an illustrative drawing representing an active device voltage divider circuit that includes multiple active devices coupled in series.

FIG. 2 is an illustrative drawing representing an active device voltage divider circuit 202 that includes multiple active devices coupled in series. Active voltage divider circuits have been provided that include multiple active field effect transistor (FET) devices Mn1-Mnk, each having its gate coupled to its drain. The multiple FET devices are coupled in series form a chain of FET devices to provide divided voltage outputs at junctions between them. The function of each series-connected FET device is the same as a resistor in a resistor voltage divider although its I-V curve is not linear and typically its area is much less than resistor to realize the same IQ. For example, a divider voltage output voltage at the drain of FET device Mn2 equals the voltage drop across the FET devices coupled between the drain of Mn2 and ground divided by a total voltage drop across all k FET devices. An active device voltage divider typically occupies less IC area to realize a given IQ than would a resistor divider. However, IQ for an active device voltage divider circuit can vary significantly with semiconductor manufacturing process corner changes.

SUMMARY

In one aspect, an active voltage divider circuit is provided. Multiple FET load devices are coupled in series between the first node and the second node. Multiple first switches, each associated with a different FET load device are configured to selectably couple a respective associated bypass circuit between source and drain of its associated FET load device. Second switch circuitry is configured to selectably couple a drain of a FET load device from among the multiple FET load devices to the third node. Multiple second switches, each associated with a different FET load device, are configured to selectably couple a drain of its associated FET load device to the third node.

In another aspect, a method is provided to configure an active divider circuit that includes a series-connected chain of FET load devices to produce a target value for a quiescent current (IQ) in response to the first node being coupled to a first voltage value ($V_1$) and the second node being coupled to a voltage value ($V_2$). A number of respective bypass circuits are coupled between source and drain of associated FET load devices of the chain so as to electrically remove those associated FET load devices from the divider circuit so as to configure the series-connected chain of FET load devices to produce the target value for the quiescent current (IQ), when the first node is coupled to the first voltage value ($V_1$) and the second node is coupled to the voltage value ($V_2$). A drain of a FET load device, selected from among one or more of the k FET load devices, is coupled to target divider voltage value ($V_3$) to the third node.

DESCRIPTION OF EMBODIMENTS

The following description is presented to enable any person skilled in the art to create and use an active device divider circuit with adjustable IQ. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known processes are shown in block diagram form in order not to obscure the description of the invention with unnecessary detail. Identical reference numerals may be used to represent different views of the same or similar item in different drawings. Thus, the present invention is not intended to be limited to the embodiments shown, but is to be accorded the widest scope consistent with the principles and features disclosed herein.

Figure 3:
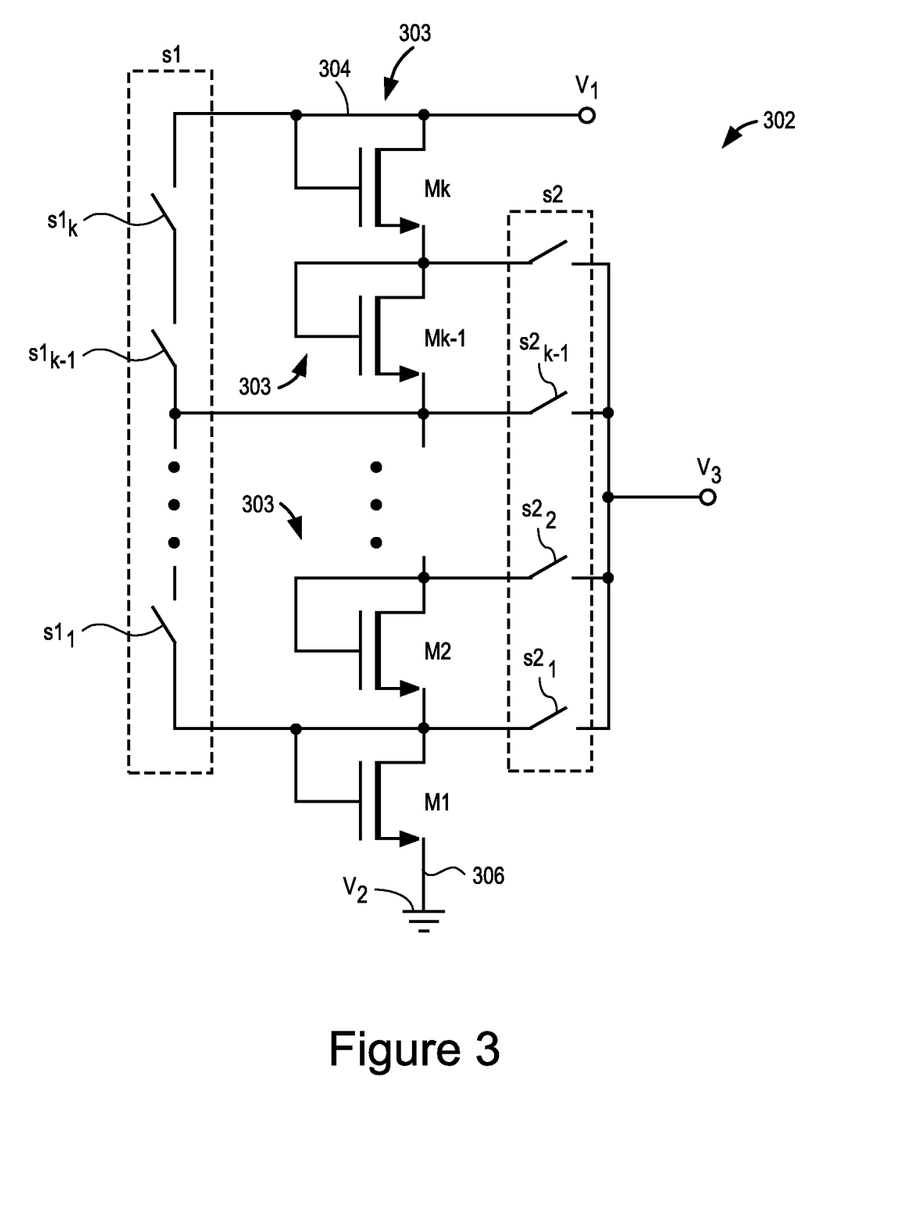
FIG. 3 is an illustrative transistor level diagram of an active voltage divider circuit in accordance with some embodiments.

FIG. 3 is an illustrative transistor level diagram of an active voltage divider circuit 302 in accordance with some embodiments. Multiple field effect transistor (FET) devices are coupled in a series-connected chain of FET devices 303 between a first node 304 and a second node 306. Each FET device of the series-connected chain has its drain coupled to its gate. In accordance with some embodiments, the drain has a short circuit coupling to its gate. A FET device with its drain coupled to its gate is referred to herein as a FET load device. During design each FET load device is implemented as an individual design cell. Assuming that the voltage divider circuit 302 includes k FET load devices coupled in series, a kth FET load device Mk of the series has its drain coupled to the first node 304. A first FET load device M1 of the series has its source coupled to the second node 306. Each of a second FET load device M2 to a $(k-1)_{th}$ FET load device M(k-1) of the series has its drain coupled to a source of an adjacent FET load device of the series that is closer to the first node 304 and has its source coupled to a drain of an adjacent FET load device of the series that is closer to the second node 306.

In operation, the first node 304 is coupled to receive a first voltage ($V_1$) and the second node 306 is coupled to receive a second voltage ($V_2$). A total voltage drop across the voltage divider circuit is $V_1-V_2$. Assuming that the voltage divider circuit includes k FET load devices, a portion of the total voltage drop across each individual FET load device in the voltage divider circuit is, $$(V_1-V_2)/k \qquad (1)$$

More specifically, the voltage drop across each FET load device, having its drain coupled to its gate, is the gate-to-source voltage drop across the device, $V_{gs\text{-}cell}$, which in some embodiments, is identical for each FET device coupled in series in voltage divider circuit. Therefore, $$V_{gs\text{-}cell} = (V_1-V_2)/k \qquad (2)$$

The voltage divider circuit 302 includes first switch circuitry S1 configured to selectably operatively electrically insert or electrically remove individual FET devices from the series. In operation, each FET load device contributes its gate-to-source voltage drop to the overall voltage drop ($V_1-V_2$). The larger the number of FET load devices inserted in series, the smaller the voltage drop across each individual FET device. Conversely, the smaller the number of FET load devices inserted in series, the larger the voltage drop across each individual FET load device.

The first switch circuitry S1, in accordance with some embodiments, includes multiple individual first switches, $S1_1$-$S1_k$, each associated with a different FET load device of the series-coupled FET load devices. Each individual first switch is configured to selectably switch between a first switch state and a second switch state. In some embodiments, each individual first switch includes at least one FET device (not shown), which is selectably controlled using a signal provided to its gate terminal. In some embodiments, switching an individual first switch between first and second states includes providing a control signal to a gate of the first device. In the first switch state, an individual first switch electrically inserts its associated FET load device in series with the other series-coupled FET load devices by open circuiting a bypass circuit current path between the source and drain of the associated FET load device. In a second switch state, the individual first switch electrically removes its associated FET load device from series coupling with the other series-coupled FET devices by closing a bypass current path that provides a short circuit current path between the source and drain of the associated FET load device.

The voltage divider circuitry 302 includes second switch circuitry S2 to selectably operatively electrically couple a third node 308 to a drain of a selectable one of the first through kth FET load devices of the series-coupled FET load devices. In operation, assuming that the second switch circuitry couples a drain of device Mk-x coupled to the third node 308, a divider output equals a voltage drop ($V_3$) between the drain of the $(k-x)_{th}$ FET load device of the series-connected FET devices and $V_2$, which is, $$V_3 = (V_1-V_2)(k-x)/k \qquad (3)$$

The larger the value of x, the farther the $n_{th}$ FET device of the series-coupled FET load devices is from the first node, and the closer the $x_{th}$ FET load device in the series-coupled FET load devices is to the first node, and the smaller the voltage drop between the third node and the second node. Conversely, the smaller the value of n, the closer the $x_{th}$ FET load device of the series-coupled FET load devices is to the first node, and the farther the $x_{th}$ FET load device in the series-coupled FET devices is from the first node, and the larger the voltage drop between the third node and the second node.

The second switch circuitry S2, in accordance with some embodiments, includes multiple individual second switches $S2_1$-$S2_{k-1}$, each associated with a different FET load device of the series-coupled FET load devices. Each second switch is controllable to switch between a first switch state and a second switch state. In some embodiments, each individual second switch includes at least one FET load device (not shown), which is selectably controlled using a signal provided to its gate terminal. In some embodiments, switching an individual second switch between first and second states includes providing a control signal to a gate of the second device. In some embodiments, the second switch circuitry S2 includes a multiplex circuit that includes multiple input terminals each coupled to a drain of a different FET load device and including an output terminal coupled to the third node 308. In the first switch state, an individual second switch operatively electrically coupled to a drain of its associated FET load device with the third node 308. In the second switch state, the individual second switch operatively electrically decouples the drain of its associated FET load device from the third node 308.

The value of IQ that flows between the series-coupled FET load devices of the active divider circuit 302 of FIG. 3 is represented by the following expression.

$$IQ = \mu_n V_T^2 (n-1) C_{ox} W/L * e^{\frac{V_{gs-cell}-V_{th}}{nV_T}} \qquad (4)$$

The parameter to represents charge mobility; $V_T$=kT/q, (where k is Boltzmann's constant, T is temperature and q is unit charge); W represents gate width; L represents gate length; n represents sub-threshold region coefficient; $C_{ox}$ represents the gate oxide capacitor; gate-to-source voltage drop across the device, $V_{gs-cell}$ represents gate-to-source voltage drop; and $V_{th}$ represents threshold voltage.

The value of a threshold voltage $V_{th}$ of a FET load device can vary with changes in semiconductor manufacturing process corners. Persons skilled in the art will appreciate that a FET load device having a smaller threshold voltage value $V_{th}$ generally switches faster than a similar FET device having a larger threshold voltage value $V_{th}$. Series-coupled FET load devices within a given active divider circuit ordinarily have about the same threshold voltages in accordance with some embodiments.

Figure 4:
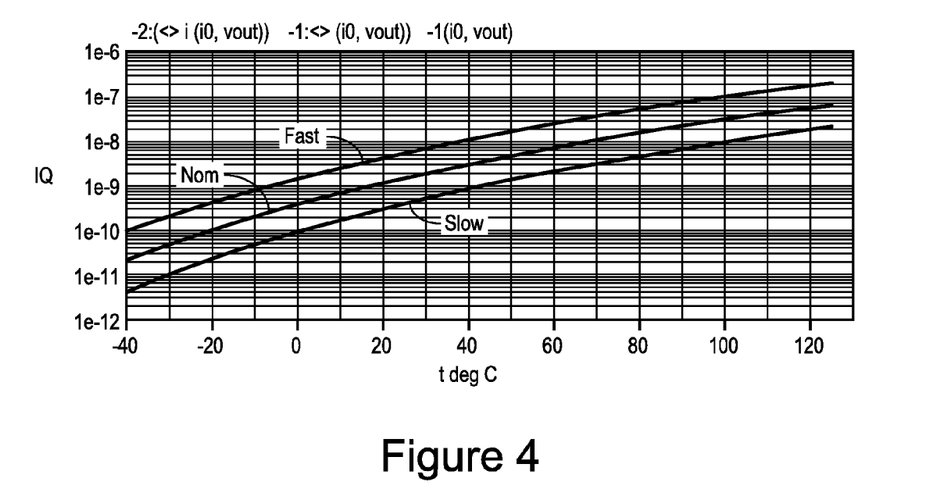
FIG. 4 is an illustrative graph representing simulation of IQ values over a range of temperatures for an active device divider circuit of the general type shown in FIG. 3 in accordance with some embodiments.

FIG. 4 is an illustrative graph representing simulation of IQ values over a range of temperatures for an active device divider circuit 302 shown in FIG. 3 in accordance with some embodiments. The "nominal" curve represents a voltage divider circuit with series-coupled FET load devices each having a nominal threshold voltage. A nominal threshold voltage is a threshold voltage that a manufacturing process is designed to produce, as contrasted with a threshold voltage at a manufacturing process corner. The "fast" curve represents a voltage divider circuit with series-coupled FET load devices each having lower than nominal threshold voltage. The "slow" curve represents a voltage divider circuit with series-coupled FET load devices each having higher than nominal threshold voltage. At all temperatures, IQ is highest for the fast, low $V_{th}$, devices, is lowest for the slow, high $V_{th}$, devices and is in between the two for the nominal, nominal $V_{th}$, devices. Thus, semiconductor manufacturing process variations can result in manufacture-related variations of threshold voltage $V_{th}$, from one voltage divider to the next, which in turn, can result in manufacture-related variation of IQ, from one voltage divider to the next. Often, however, it is desirable to maintain target IQ, such as a nominal value IQ, that is sufficient provide sufficient power to provide basic functionality and that is low so as to conserve power, for example.

Figure 5:
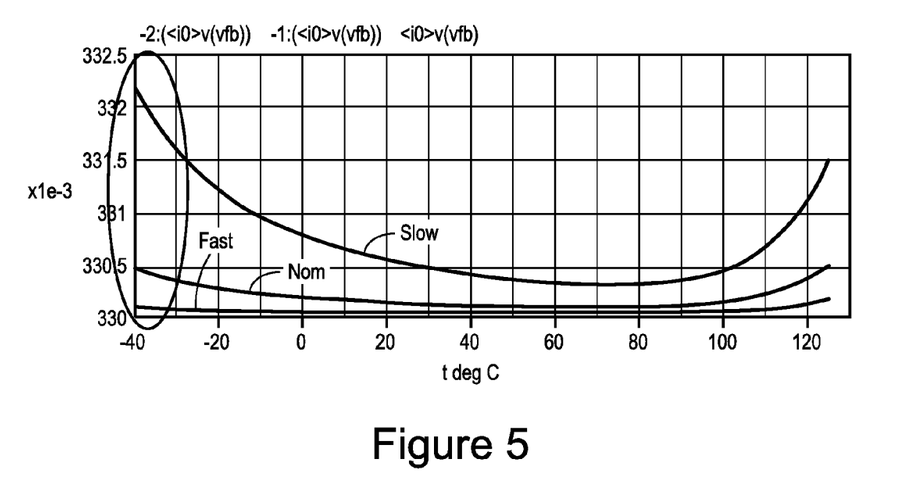
FIG. 5 is an illustrative graph representing simulation of divider output values over a range of temperatures for an active device divider circuit of the general type shown in FIG. 3 in accordance with some embodiments.

FIG. 5 is an illustrative graph representing simulation of divider output values over a range of temperatures for an active device divider circuit of the general type shown in FIG. 3 in accordance with some embodiments. The fast, low $V_{th}$, divider circuit has the least variation of divider output voltage $V_3$ with temperature. The slow, high $V_{th}$, divider circuit has the greatest variation of divider output voltage $V_3$ with temperature. The nominal, nominal $V_{th}$ divider circuit has a variation of divider output voltage $V_3$ with temperature that falls between the other two. The marked region of the graph near −40 degrees C. indicates that too small an IQ at low temperature will damage the accuracy of divider due to the influence of leakage current as described with reference to FIG. 7.

Figure 6:
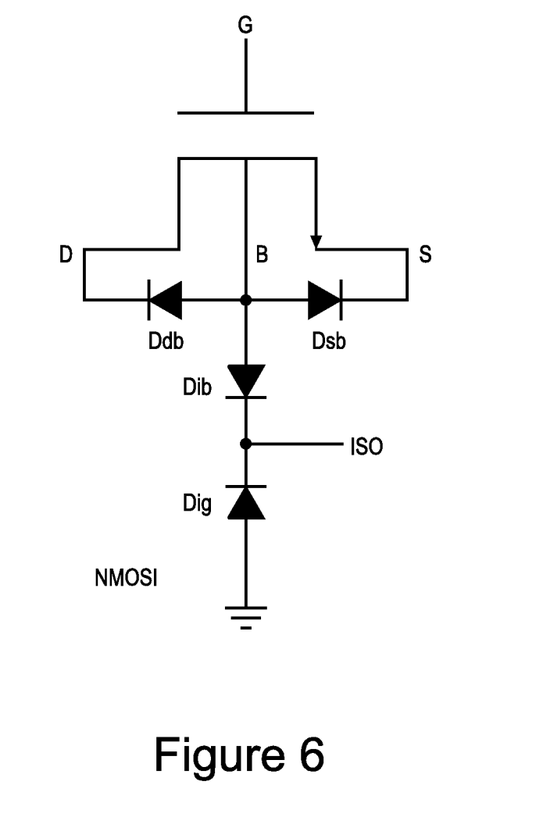
FIG. 6 is an illustrative transistor level diagram representing coupling among terminals of a FET load device in accordance with some embodiments.

FIG. 6 is an illustrative transistor level diagram representing coupling among terminals of a FET load device in accordance with some embodiments. Each FET load device includes an isolated MOSFET, which includes an NMOS device in a deep nwell. Alternatively, a PMOS device can be used in some embodiments. A body (B) of the FET is coupled to the source terminal. In accordance with some embodiments, the isolation (ISO) is coupled to a voltage, such as the highest voltage in the circuit so as to avoid forward bias of $D_{ib}$. For an isolated NMOS device, the ISO is a deep nwell, and body is a pwell. The electrical coupling between body (B) and source results in a diode $D_{bd}$ between body and drain, a diode $D_{sb}$ between body and source, a diode $D_{ib}$ between body and ISO, and diode $D_{ig}$ is the diode between ISO and substrate and substrate is usually connected to ground.

Figure 7:
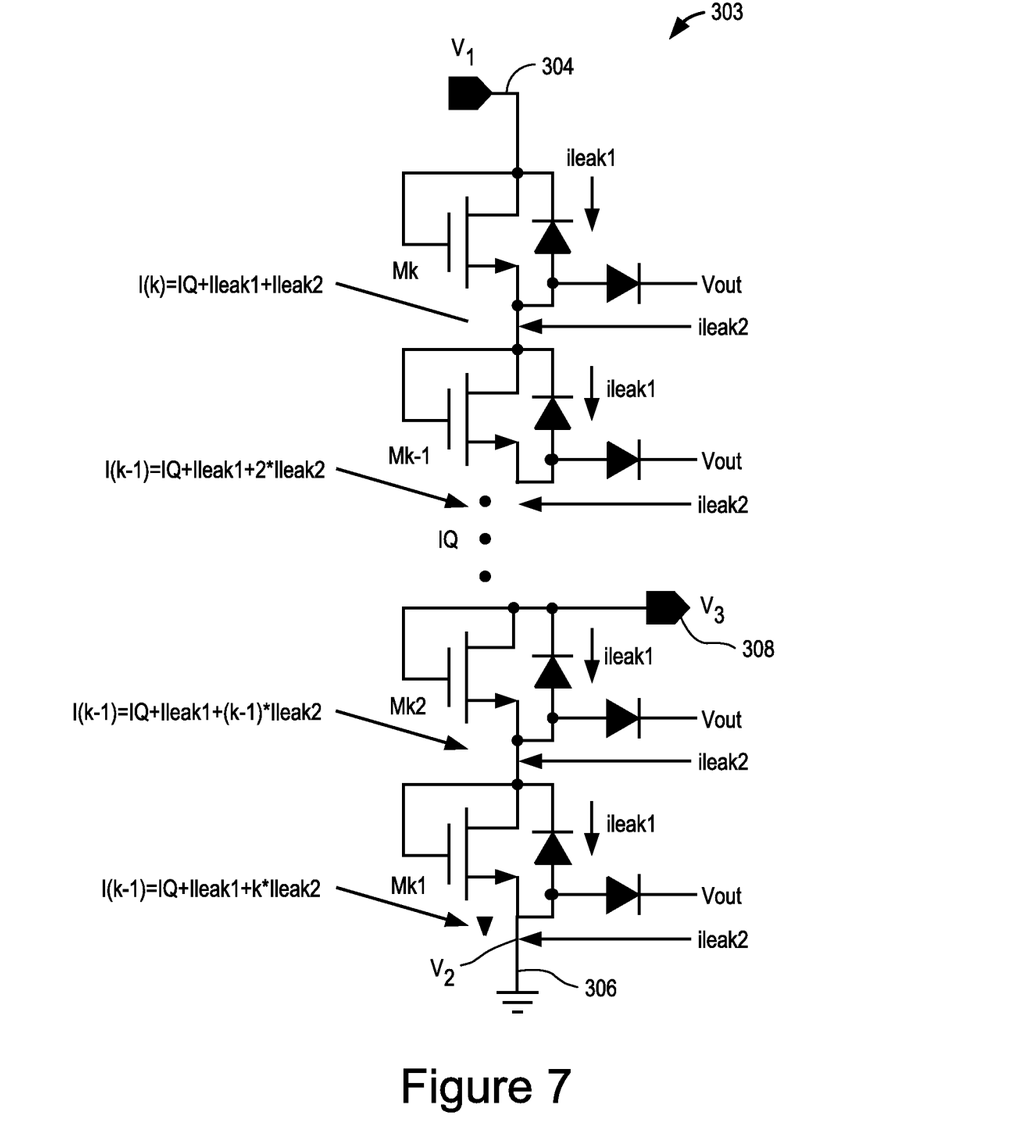
FIG. 7 is an illustrative transistor level diagram, showing IQ and leakage currents in accordance with some embodiments.

FIG. 7 is an illustrative transistor level diagram diagrams representing the series-connected chain 303 of FET load devices of FIG. 3 showing IQ and leakage currents in accordance with some embodiments. Each FET load device has a first leakage current Leak', which is a drain to source leakage current. Each FET load device also has a second leakage current $I_{Leak2}$, from the ISO to the source. The second leakage currents $I_{Leak2}$ in the series-connected devices accumulate as current flows from one the FET load device to the next. For example, the kth FET load device has a source current of I(k)=IQ+$I_{Leak1}$+$I_{Leak2}$. However, the first FET load device has a source current of I(k)=IQ+$I_{Leak1}$+ K*$I_{Leak2}$. Thus, the second leakage current $I_{Leak2}$ has accumulates by a factor of approximately k as current flows through the k series-connected FET load devices from device Mk to device M1.

Referring again to equation (4), it will be appreciated that since IQ is larger for fast, lower $V_{th}$, devices and that IQ is smaller for slow higher $V_{th}$, devices, leakage current is larger relative to IQ slow, higher $V_{th}$, devices than it is relative to fast, lower $V_{th}$ devices. Thus, leakage current has a larger value relative to IQ for slow, higher $V_{th}$ devices, which can result in current of bottom cell (M1) being larger than current of the top cell Mk, which can result in the $V_3$ being larger than its target value, for example.

Also, it will be appreciated from equation (4) that, for a given threshold voltage value $V_{th}$, IQ increases with an increasing value of $V_{gs-cell}$ and decreases with a decreasing value of $V_{gs-cell}$. Moreover, it will be appreciated that Vgs-cell per FET load device varies with the number of FET load devices coupled in series between $V_1$ and $V_2$. The total voltage drop across all series-connected FET load devices is $(V_1-V_2)$, and the voltage drop across each FET load device is, $$V_{gs-cell}=(V1-V2)/N_{S1} \qquad (5)$$

The parameter $N_{S1}$ is the number of FET load devices electrically inserted in series in the active divider circuit by switch circuitry S1.

Figures 8A, 8B, 8C:
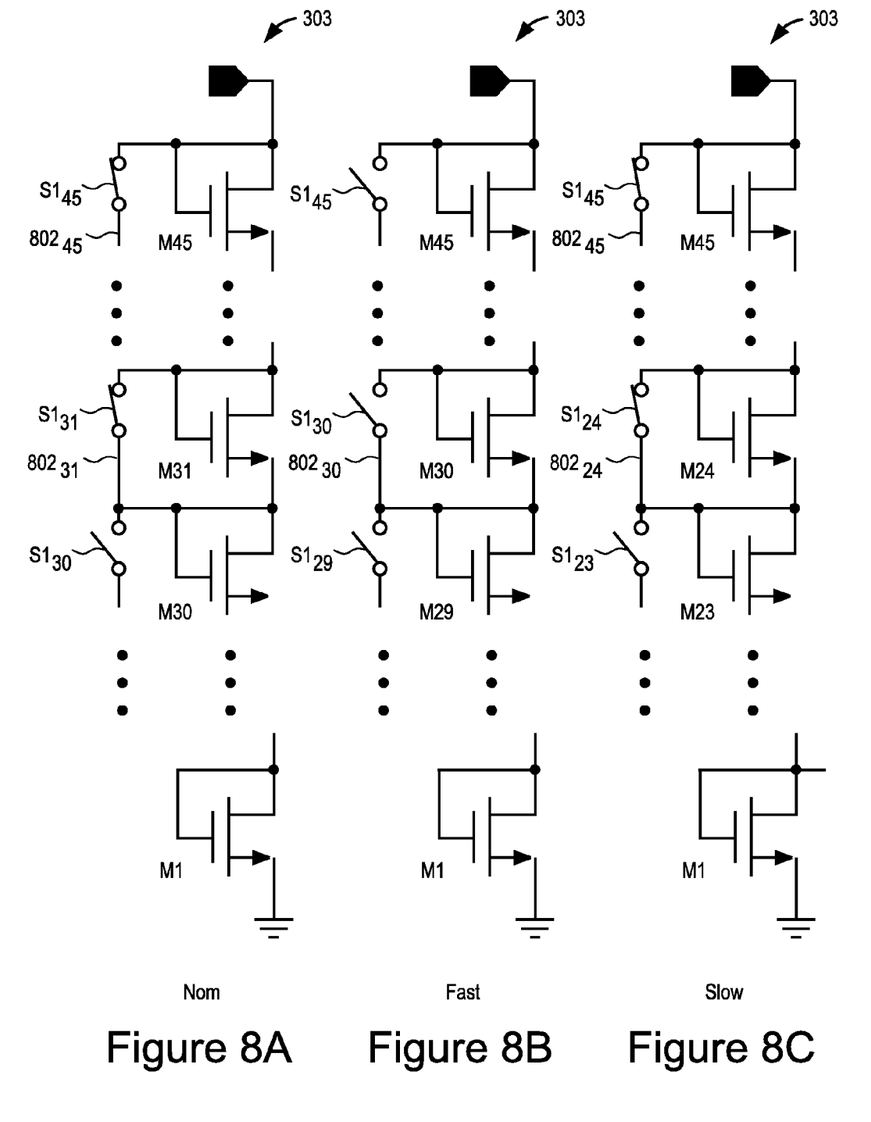
FIGS. 8A-8C are illustrative transistor circuit diagrams representing the series-connected chain of FET load devices of FIG. 3 configured with different example switch states of individual first switches to insert different numbers of FET load devices in series so as to achieve substantially the same IQ for active divider circuits having FET load devices with different threshold voltages, in accordance with some embodiments.

FIGS. 8A-8C are illustrative transistor circuit diagrams representing the series-connected chain 303 of FET load devices of FIG. 3 configured with different example switch states of individual first switches, $S1_1$-$S1_{45}$, to insert different numbers of FET load devices in series so as to achieve substantially the same IQ for active divider circuits having FET load devices with different threshold voltages, in accordance with some embodiments. The different threshold voltage, $V_{th}$, values for different divider circuits may result from different process corners during IC fabrication, for example. In the examples of FIGS. 8A-8C and FIGS. 9A-9C, it is assumed that the target IQ is 1.4 nA; $V_1$=3V; $V_2$=ground; target $V_3$=1.2V; W/L=40 μm/0.5 μm; and mvt 3V NMOS as the unit FET load device. In accordance with some embodiments, mvt 3V means a medium $V_{th}$ mosFET for 3V maximum voltage. Since 3V is the smallest $V_{th}$ device that can be obtained for some manufacturing processes, it is the value used to get best resolution in the divider structure for some embodiments.

In the examples of FIGS. 8A-8C, the switch states of the individual first switches $S1_1$-$S1_{45}$, which are coupled in series, are selected during a trimming operation. One or more individual first switches may be switched to a second switch state to electrically couple respective short circuit bypass paths between source and drain of their associated FET load devices to thereby trim, i.e. electrically remove, their associated FET load devices from the active divider circuit. Other individual first switches are switched to the first switch state to open-circuit respective short circuit bypass paths between source and drain of their associated FET load devices to thereby electrically insert their associated FET load devices in the active divider circuit. In order to determine which FET load devices to trim, i.e. remove, and which to insert, In some embodiments, an active divider circuit is tested at normal operating temperature to determine the states of first switch circuitry and second switch circuitry. More particularly, in accordance with some embodiments, a voltage source and a current meter are connected to the active divider circuit to test the IQ in normal temperature to determine how many cells are electrically inserted in the series-connected chain 303 and how many are electrically removed from the series-connected chain 303.

FIG. 8A is an illustrative transistor circuit diagram representing switch states of individual first switches to insert a first number of FET load devices in series so as to achieve a target IQ for an example active divider circuit having FET load devices with nominal threshold voltage, in accordance with some embodiments. Example simulation results were obtained for 25 degrees C. The example simulation results show, for example, that switching first switches $S1_1$-$S1_{30}$ to the first state to electrically insert thirty FET load devices M1-M30 in series, and switching first switches $S1_{31}$-$S1_{45}$ to the second state to remove FET load devices M31-M45 from the series, results in IQ=1.4 nA, which matches the target IQ. It is noted, for example, that first switch $S1_{31}$ associated with FET load device M31 is in the second switch state, which is closed state in some embodiments, to thereby couple a short circuit bypass path $802_{31}$ between source and drain of M31 to thereby electrically remove M31 preventing it from acting as a load during operation of the active divider circuit.

FIG. 8B is an illustrative transistor circuit diagram representing switch states of individual first switches to insert a second number of FET load devices in series so as to achieve the target IQ for an example active divider circuit having "fast" FET load devices with lower than nominal threshold voltage, in accordance with some embodiments. Example simulation results were obtained for 25 degrees C. The example simulation results show, for example, in which process corner performance is set so that results are that in the fast corner simulation, which is the worst case. In the example fast FET devices, first switches $S1_1$-$S1_{45}$ are switched to the first state to electrically insert forty-five FET load devices M1-M45 in series, and none of the first switches $S1_1$-$S1_{45}$ is switched to the second state to remove none of the FET load devices M1-M45 from the series, results in IQ=1.3 nA, which within an acceptable tolerance range in this example. It is noted, for example, that first switch $S1_{30}$ associated with FET load device M30 is in the first switch state, which is an open state in some embodiments, to thereby open-circuit to decouple a bypass path $802_{30}$ from between source and drain of M30 to thereby electrically insert M30 so that it acts as a load during operation of the active divider circuit.

FIG. 8C is an illustrative transistor circuit diagram representing switch states of individual first switches to insert a third number of FET load devices in series so as to achieve the target IQ for an example active divider circuit having "slow" FET load devices with higher than nominal threshold voltage, in accordance with some embodiments. Example simulation results were obtained for 25 degrees C. The example simulation results show, for example, in which process corner performance is set so that results are that in the slow corner simulation, which is the worst case. In the example slow FET devices, first switches $S1_1$-$S1_{23}$ are switched to the first state to electrically insert twenty-three FET load devices M1-M23 in series, and twenty-one of the first switches $S1_{24}$-$S1_{45}$ are switched to the second state to remove twenty-one of the FET load devices M24-M45 from the series, results in IQ=1.2 nA, which is within an acceptable tolerance range in this example.

Referring to FIG. 8A and equation (4), it will be appreciated that in the "nominal" example, with thirty FET devices M1-M30 coupled in series, the $V_{cg\text{-}cell}$ for each device is $(V_2-V_1)/30$. Referring to FIG. 8B and equation (4), it will be appreciated that, in the "fast" example, with forty-five FET devices M1-M45 coupled in series, the $V_{cg\text{-}cell}$ for each device is $(V_2-V_1)/45$. Thus, the lower value of $V_{cg\text{-}cell}$ for each device resulting from the first switch configuration of FIG. 8B compensates for the lower threshold voltage $V_{th}$ of each device relative to the nominal threshold voltage. Conversely, referring to FIG. 8C and equation (4), it will be appreciated that, in the "slow" example, with twenty-three FET devices M1-M23 coupled in series, the $V_{cg\text{-}cell}$ for each device is $(V_2-V_1)/23$. Thus, the larger value of $V_{cg\text{-}cell}$ cell for each device resulting from the first switch configuration of FIG. 8C compensates for the higher threshold voltage $V_{th}$ of each device relative to the nominal threshold voltage.

Figures 9A, 9B, 9C:
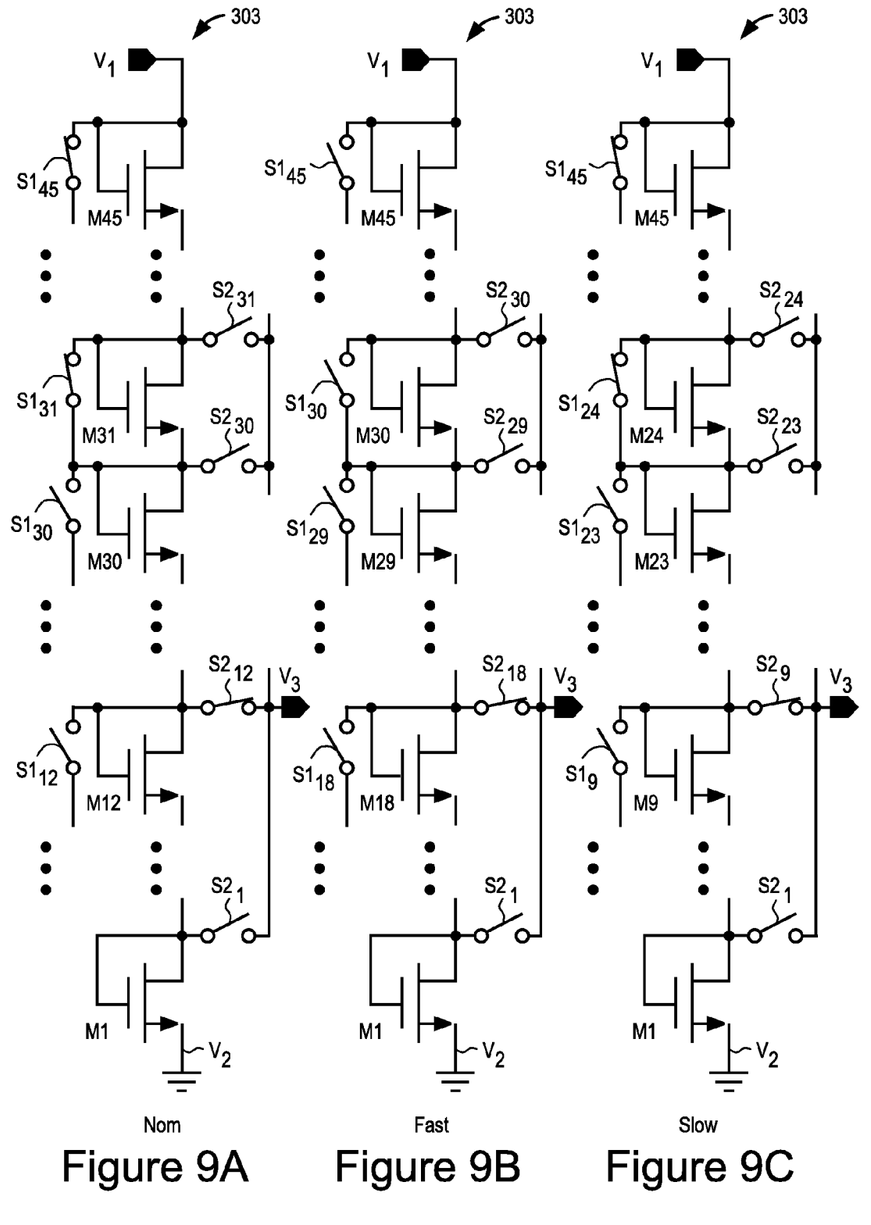
FIGS. 9A-9C are illustrative transistor circuit diagrams representing the series-connected chain of FET load devices of FIG. 3 configured with different example switch states of individual second switches to electrically couple the drain of different selected FET load devices the third node to achieve a target divider output voltage value for active divider circuits having FET load devices with different threshold voltages, in accordance with some embodiments.

FIGS. 9A-9C are illustrative transistor circuit diagrams representing the series-connected chain 303 of FET load devices of FIG. 3 configured with different example switch states of individual second switches, $S2_1$-$S2_{45}$, which are coupled in parallel, to electrically couple the drain of different selected FET load devices the third node 308 to achieve a target $V_3$ value for active divider circuits having FET load devices with different threshold voltages, in accordance with some embodiments. The switch states for the second switch circuitry S2 are selected following determination of switch states for the first switch circuitry S1 in accordance with some embodiments. More particularly, in accordance with some embodiments, switch states of the second switch circuitry are selected to achieve a target $V_3$ value as a function of the number of FET load devices electrically inserted in series using the first switch devices in accordance with the following relationship.

$$V_3=(V_2-V_1)*N_{S2}/N_{S1} \tag{6}$$

The parameter $N_{S2}$ is the number of FET load devices electrically coupled in series to the third node.

FIG. 9A is an illustrative transistor circuit diagram representing switch states of individual second switches to insert a first number of FET load devices in series to the third node so as to achieve a target $V_3$ value for the first switch configuration for the "nominal" example of FIG. 8A, in accordance with some embodiments. Specifically, $S2_{12}$ is in the first switch state, which acts to couple a drain of device M12 to the third node. All other second switches are in the second switch state. Thus, for the nominal example, $V_3$=(3V)*12/30=1.2V.

FIG. 9B is an illustrative transistor circuit diagram representing switch states of individual second switches to insert a second number of FET load devices in series to the third node so as to achieve a target $V_3$ value for the first switch configuration for the "fast" example of FIG. 8B, in accordance with some embodiments. Specifically, $S2_{18}$ is in the first switch state, which acts to couple a drain of device M18 to the third node. All other second switches are in the second switch state. Thus, for the fast example, $V_3$=(3V)*18/45=1.2V.

FIG. 9C is an illustrative transistor circuit diagram representing switch states of individual second switches to insert a third number of FET load devices in series to the third node so as to achieve a target $V_3$ value for the first switch configuration for the "slow" example of FIG. 8C, in accordance with some embodiments. Specifically, $S2_9$ is in the first switch state, which acts to couple a drain of device M9 to the third node. All other second switches are in the second switch state. Thus, for the fast example, $V_3$=(3V)*9/23=1.17V, which is assumed to be within an acceptable tolerance range in this example.

The foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A programmable quiescent current reference circuit comprising:
   a first node;
   a second node;
   a third node;
   multiple transistor load devices coupled in series between the first node and the second node;
   multiple first switches, each associated with a different transistor load device to selectably bypass its associated transistor load device; and
   second switch circuitry configured to selectably couple a first terminal of a selected transistor load device, from among the multiple transistor load devices, to the third node, while de-coupling the other transistor load devices, from among the multiple transistor load devices, from the third node.

2. The circuit of claim 1, wherein the multiple first switches are coupled in series.

3. The circuit of claim 1, wherein the second switch circuitry includes multiple second switches, each associated with a different transistor load device and configured to selectably couple a first terminal of its associated transistor load device to the third node.

4. The circuit of claim 1, wherein the multiple respective associated first switches include circuit paths between first and second terminals of associated transistor load devices.

5. The circuit of claim 1, wherein each transistor load device includes an NMOS FET that includes a body and a P-well; and wherein a second terminal of the NMOS FET is coupled to the body.

6. The circuit of claim 1, wherein the multiple first switches are configured to couple a number of respective bypass circuits between first and second terminals of associated transistor load devices to configure the series-connected transistor load devices to produce a target value for a quiescent current (IQ), when the first node is coupled to a first voltage value (V1) and the second node is coupled to a voltage value (V2).

7. The circuit of claim 6, wherein the target value for IQ is based upon a nominal threshold voltage for transistor load devices; and
   wherein the transistor load devices have threshold voltages that are larger than a nominal threshold voltage.

8. The circuit of claim 6, wherein the target value for IQ is based upon a nominal threshold voltage for transistor load devices; and
   wherein the transistor load devices have threshold voltages that are smaller than a nominal threshold voltage.

9. The circuit of claim 1, wherein the second switch circuitry includes multiple second switches configured to couple the first terminal of a transistor load device, selected from among one or more of the k transistor load devices, to couple a target divider voltage value (V3) to the third node, when the first node is coupled to a first voltage value (V1) and the second node is coupled to a voltage value (V2).

10. The circuit of claim 1, wherein the multiple first switches are configured to couple a number of respective bypass circuits between first and second terminals of associated transistor load devices to configure the series-connected transistor load devices to produce a target value for a quiescent current (10), when the first node is coupled to a first voltage value (V1) and the second node is coupled to a voltage value (V2); and
   wherein the second switch circuitry includes multiple second switches configured to couple the first terminal of a transistor load device, selected from among one or more of the k transistor load devices, to couple a target divider voltage value (V3) to the third node, when the first node is coupled to a first voltage value (V1) and the second node is coupled to a voltage value (V2).

11. The circuit of claim 1, wherein the first node is coupled to a voltage V1;
   wherein the second node is coupled to a voltage V2; and
   wherein the multiple first switches are configured to couple a number of respective bypass circuits between first and second terminals of associated transistor load devices to configure the series-connected transistor load devices to produce a target value for a quiescent current (IQ).

12. The circuit of claim 11, wherein the target value for IQ is based upon a nominal threshold voltage for transistor load devices; and
   wherein the transistor load devices have threshold voltages that are larger than a nominal threshold voltage.

13. The circuit of claim 11, wherein the target value for IQ is based upon a nominal threshold voltage for transistor load devices; and
   wherein the transistor load devices have threshold voltages that are smaller than a nominal threshold voltage.

14. The circuit of claim 1, wherein the first node is coupled to a voltage V1;
   wherein the second node is coupled to a voltage V2; and
   wherein the second switch circuitry includes multiple second switches configured to couple the first terminal of a transistor load device, selected from among one or more of the k transistor load devices, to couple a target divider voltage value (V3) to the third node.

15. The circuit of claim 1, wherein the first node is coupled to a voltage V1;
wherein the second node is coupled to a voltage V2;
wherein the multiple first switches are configured to couple a number of respective bypass circuits between first and second terminals of associated transistor load devices to configure the series-connected transistor load devices to produce a target value for a quiescent current (IQ); and
wherein the second switch circuitry includes multiple second switches configured to couple the first terminal of a transistor load device, selected from among one or more of the k transistor load devices, to couple a target divider voltage value (V3) to the third node.

16. A circuit comprising:
a first voltage node;
a second voltage node;
a third output node;
k FET devices each having a drain, a source, and a gate, and each having its drain coupled to its gate;
wherein k is an integer greater than one;
wherein the k FET devices are coupled in series between the first node and the second node to form a series connected chain of FET devices, wherein a kth FET device of the chain has its drain electrically coupled to the first node, a first device of the chain has its source electrically coupled to the second node, and each of a second FET device to a k−1 FET device of the chain has its drain coupled to a source of an adjacent FET device of the chain closer to the first node and has its source electrically coupled to a drain of an adjacent FET device of the chain closer to the second node;
multiple first switches coupled in series, and each associated with a different FET device, and configured to selectably couple a bypass current path in parallel with its associated FET device;
a multiplex circuit that includes multiple input terminals each coupled to a drain of a different FET load device and including an output terminal coupled to the third node.

17. A circuit comprising:
a first node;
a second node;
a third node;
k FET load devices coupled in series between the first node and the second node;
wherein k is an integer greater than one;
means for selectably coupling respective bypass circuits between source and drain of respective FET load devices; and
means for selecting from among multiple FET load devices and for coupling a drain of a selected one FET load device to the third node, and for de-coupling the other FET load devices, from among the multiple FET load devices, from the third node.

18. A method to configure an active divider circuit that includes a series-connected chain of active load devices to produce a target value for a quiescent current (IQ) with the first node being coupled to a first voltage value (V1) and the second node being coupled to a voltage value (V2), the method comprising:
bypassing selected associated load devices so as to configure the series-connected chain of load devices to produce the target value for the quiescent current (IQ), when the first node is coupled to the first voltage value (V1) and the second node is coupled to the voltage value (V2); and
coupling a selected load device to couple a target divider voltage value (V3) to the third node.

19. The method of claim 18, wherein the target value for IQ is based upon a nominal threshold voltage for load devices; and
wherein the load devices have threshold voltages that are larger than a nominal threshold voltage.

20. The circuit of claim 18, wherein the target value for IQ is based upon a nominal threshold voltage for load devices; and
wherein the load devices have threshold voltages that are smaller than a nominal threshold voltage.

* * * * *

UNITED STATES PATENT AND TRADEMARK OFFICE
CERTIFICATE OF CORRECTION

PATENT NO. : 9,813,056 B2  
APPLICATION NO. : 14/885601  
DATED : November 7, 2017  
INVENTOR(S) : Shao et al.

Page 1 of 1

It is certified that error appears in the above-identified patent and that said Letters Patent is hereby corrected as shown below:

In the Claims

In Column 10, Line 33, in Claim 10, delete "(10)," and insert --(IQ),-- therefor In Column 11, Line 20, in Claim 16, before "FET", insert --transistor--

In Column 11, Line 25, in Claim 16, before "FET", insert --transistor-- (First Occurrence)

Signed and Sealed this  
Twenty-eighth Day of May, 2019

Andrei Iancu  
*Director of the United States Patent and Trademark Office*